United States Patent [19]
Omori

[11] Patent Number: 5,825,222
[45] Date of Patent: Oct. 20, 1998

[54] HORIZONTAL SYNCHRONOUS CIRCUITS

[75] Inventor: Masayuki Omori, Tokyo, Japan

[73] Assignee: Sony Corporation, Tokyo, Japan

[21] Appl. No.: 758,948

[22] Filed: Dec. 3, 1996

[30] Foreign Application Priority Data

Dec. 4, 1995 [JP] Japan ..................... 7-315124

[51] Int. Cl.$^6$ ..................... H03L 7/08
[52] U.S. Cl. ............ 327/156; 327/155; 331/11; 331/25
[58] Field of Search .............. 331/11, 17, 20, 331/25, 34; 327/154–159; 375/376; 348/735, 540

[56] References Cited

U.S. PATENT DOCUMENTS

| | | | |
|---|---|---|---|
| 4,037,165 | 7/1977 | Ogita | 329/124 |
| 5,347,233 | 9/1994 | Ishibashi et al. | 331/2 |
| 5,563,552 | 10/1996 | Gersbach et al. | 331/1 A |
| 5,640,126 | 6/1997 | Mellot | 329/325 |

*Primary Examiner*—Timothy P. Callahan
*Assistant Examiner*—An T. Luu
*Attorney, Agent, or Firm*—Frommer Lawrence & Haug LLP; William S. Frommer

[57] ABSTRACT

A horizontal synchronous circuit comprises a horizontal oscillator, an AFC portion operative to compare in phase a horizontal oscillation output signal from the horizontal oscillator with a horizontal synchronizing signal from the outside to produce a comparison output signal and to supply the horizontal oscillator with a control signal based on the comparison output signal for controlling a frequency of the horizontal oscillation output signal, a free-running frequency controller operative to produce a control signal corresponding to a frequency of the horizontal synchronizing signal from the outside and to supply the horizontal oscillator with the control signal for controlling a free-running frequency of the horizontal oscillator to be coincident with the frequency of the horizontal synchronizing signal from the outside, and a negative feedback control portion operative to produce an additional control signal based on the comparison output signal obtained from the AFC portion or the control signal supplied to the horizontal oscillator and to control the free-running frequency of the horizontal oscillator to vary in response to the additional control signal.

14 Claims, 2 Drawing Sheets

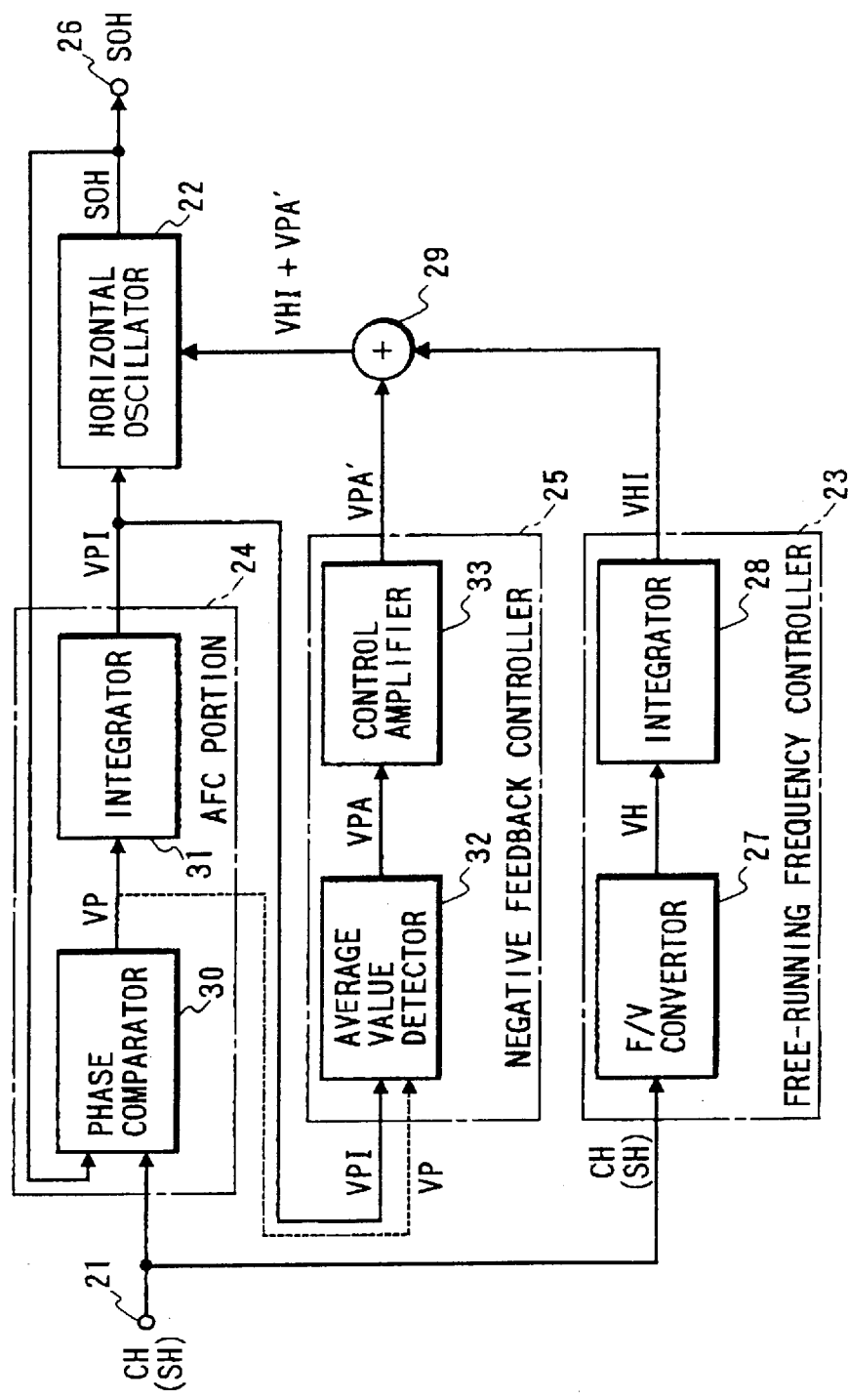

HORIZONTAL SYNCHRONOUS CIRCUITS

BACKGROUND OF THE INVENTION

1. Field of the Invention

The present invention relates generally to horizontal synchronous circuits, and is directed to an improvement in a horizontal synchronous circuit which is fit for employment in an image displaying apparatus operative to display on an image screen selectively images reproduced based on various kinds of video signals containing respective horizontal synchronizing signals of different frequencies, so as to generate a horizontal output signal in synchronism with a horizontal synchronizing signal contained in a video signal, images represented by which are displayed on the image screen.

2. Description of the Prior Art

With remarkable developments in information processing apparatus and information communicating apparatus, there has been proposed a multi-use image display apparatus which is able to display on an image screen selectively images reproduced based on various kinds of video signals containing respective horizontal synchronizing signals of different frequencies, such as video signals obtained from television broadcast signals, video signals derived from computers and so on. In such a multi-use image display apparatus as to be able to cope appropriately with the various kinds of video signals containing respective horizontal synchronizing signals of different frequencies, it is required to generate horizontal and vertical output signals synchronizing respectively with horizontal and vertical synchronizing signals contained in the various kinds of video signals, for example, in the same manner as conventional television receivers, for displaying images reproduced based on the various kinds of video signals. Accordingly, a horizontal synchronous circuit for generating the horizontal output signal and a vertical synchronous circuit for generating the vertical output signal are provided in the multi-use image display apparatus.

The horizontal synchronous circuit employed in the multi-use image display apparatus is constituted, in the same manner as that employed in the conventional television receiver, with a horizontal oscillator circuit portion for producing a horizontal oscillation output signal having a frequency expected to be coincident with a frequency of a horizontal synchronizing signal contained in a video signal supplied from the outside and an automatic frequency control (AFC) portion accompanying with the horizontal oscillator circuit portion. In general, an adjustable frequency range set by the AFC portion to the horizontal oscillation output signal obtained from the horizontal oscillator circuit portion, namely, a leading-in frequency range in the AFC portion is relatively narrow such as several percents of a free-running frequency of the horizontal oscillator circuit portion. Therefore, it is feared that horizontal oscillation output signals corresponding appropriately to a plurality of horizontal synchronizing signals having respective frequencies different by relatively large degrees from one another, respectively, can not be selectively obtained from the horizontal synchronous circuit. Consequently, to avoid such a concern, the horizontal synchronous circuit employed in the multi-use image display apparatus is provided, in addition to the AFC portion, with a control circuit portion for controlling the free-running frequency of the horizontal oscillator circuit portion to be coincident with the frequency of the horizontal synchronizing signal contained in the video signal supplied from the outside.

FIG. 1 shows an example of a previously proposed horizontal synchronous circuit which is provided with such a control circuit portion as described above for controlling a free-running frequency of a horizontal oscillator circuit portion to be coincident with a frequency of a horizontal synchronizing signal contained in a video signal from the outside. In the horizontal synchronous circuit shown in FIG. 1, under a condition in which a composite synchronizing signal CH including a horizontal synchronizing signal SH contained in the video signal from the outside is supplied to a terminal 11, the frequency of a horizontal oscillation output signal SOH obtained from a horizontal oscillator 12 is controlled by a free-running frequency controller 13 and an AFC portion 14.

The free-running frequency controller 13 is constituted with a frequency to voltage convertor (F/V convertor) 15 for producing a voltage signal VH which corresponds to the frequency of the horizontal synchronizing signal SH included in the composite synchronizing signal CH from the terminal 11 supplied thereto and an integrator 16 for integrating the voltage signal VH from the F/V convertor 15 and thereby for producing an integration output to be derived therefrom as a control signal VHI. The free-running frequency controller 13 supplies the horizontal oscillator 12 with the control signal VHI so as to control the free-running frequency of the horizontal oscillator 12 to be coincident with the frequency of the horizontal synchronizing signal SH included in the composite synchronizing signal CH from the terminal 11.

The AFC portion 14 is constituted with a phase comparator 17 operative to compare in phase the horizontal oscillation output signal SOH obtained from the horizontal oscillator 12 with the horizontal synchronizing signal SH included in the composite synchronizing signal CH from the terminal 11 and thereby to produce a comparison output signal VP, and an integrator 18 for integrating the comparison output signal VP and thereby for producing an integration output to be derived therefrom as a control signal VPI to be supplied to the horizontal oscillator 12. The AFC portion 14 controls, in response to the control signal VPI, the horizontal oscillation output signal SOH obtained from the horizontal oscillator 12 to have a frequency coincident with the frequency of the horizontal synchronizing signal SH included in the composite synchronizing signal CH from the terminal 11 so as to synchronize with the horizontal synchronizing signal SH.

The horizontal oscillation output signal SOH obtained from the horizontal oscillator 12 under such a situation as mentioned above is led to an output terminal 19.

In the horizontal synchronous circuit as shown in FIG. 1, when a difference between the frequency of the horizontal oscillation output signal SOH obtained from the horizontal oscillator 12 and the frequency of the horizontal synchronizing signal SH included in the composite synchronizing signal CH from the terminal 11 resides in an adjustable frequency range set in the AFC portion 14 to the horizontal oscillation output signal SOH, the frequency of the horizontal oscillation output signal SOH obtained from the horizontal oscillator 12 can be kept coincident with the frequency of the horizontal synchronizing signal SH included in the composite synchronizing signal CH under the control operation of the AFC portion 14.

In such a case, since the control to which the free-running frequency of the horizontal oscillator 12 is subjected is an open loop control, there is a problem that an error control arises due to variations in oscillation frequency of the horizontal oscillator 12 against the control signal VHI, nonlinear control characteristic and so on, so that an error is introduced in setting of the free-running frequency of the horizontal oscillator 12. If an error in the horizontal oscillation output signal SOH resulting from the error introduced in setting of the free-running frequency of the horizontal oscillator 12 resides in the adjustable frequency range set in the AFC portion 14 to the horizontal oscillation output signal SOH, the horizontal oscillation output signal SOH obtained from the horizontal oscillator 12 can be in synchronism to a certain extent with the horizontal synchronizing signal SH included in the composite synchronizing signal CH under the adjusting operation of the AFC portion 14. However, taking stability of synchronization and so on into consideration, it is insufficient for the horizontal oscillation output signal SOH thus obtained to synchronize merely with the horizontal synchronizing signal SH.

For example, when the free-running frequency of the horizontal oscillator 12 is erroneously set, a synchronous control for the horizontal oscillation output signal SOH performed by the AFC portion 14 results in stabilization under a condition in which the horizontal oscillation output signal SOH has a certain phase difference compared with the horizontal synchronizing signal SH. Thereby, in an image reproducing portion connected to the output terminal 19, to which the horizontal oscillation output signal SOH is led as a horizontal output signal, such problems that images reproduced under a synchronous condition based on the horizontal output signal have phase errors toward the horizontal synchronizing signal SH included in the composite synchronizing signal CH from the terminal 11 and are lacking in fidelity in reproduction.

Further, when the synchronous control for the horizontal oscillation output signal SOH performed by the AFC portion 14 results in stabilization under the condition in which the horizontal oscillation output signal SOH has the phase difference compared with the horizontal synchronizing signal SH, a signal component of a vertical synchronizing signal SV included in the composite synchronizing signal CH from the terminal 11 appears in the comparison output signal VP obtained from the phase comparator 17. As a result, in the image reproducing portion connected to the output terminal 19, to which the horizontal oscillation output signal SOH is led as the horizontal output signal, it is feared that the images reproduced under the synchronous condition based on the horizontal output signal has undesirable distortions at a portion thereof displayed on the upper portion of an image screen.

It is possible to avoid the above mentioned condition in which the horizontal oscillation output signal SOH has the phase difference compared with the horizontal synchronizing signal SH, for example, by means of providing a control portion for adjusting the phase of the horizontal oscillation output signal SOH supplied from the horizontal oscillator 12 to the phase comparator 17. Accordingly, in the case where the horizontal synchronous circuit shown in FIG. 1 is used alone and the output terminal 19 of that horizontal synchronous circuit is connected to the image reproducing portion on which reproduced images are obtained, the condition in which the horizontal oscillation output signal SOH has the phase difference compared with the horizontal synchronizing signal SH is not so serious problem. However, in the case of an image projecting system in which a plurality of video projectors each arranged to reproduce the same image are used in such a manner that the images reproduced by the video projectors, respectively, are superimposed one another to obtain a light reproduced image, and a plurality of horizontal synchronous circuits shown in FIG. 1 are applied to the video projectors, respectively, the condition in which the horizontal oscillation output signal SOH has the phase difference compared with the horizontal synchronizing signal SH arising in each horizontal synchronous circuit is serious problem.

First, the amount of the phase difference between the horizontal oscillation output signal SOH and the horizontal synchronizing signal SH depends on precision in setting of the free-running frequency of the horizontal oscillator 12 and therefore it it required that the phase of the horizontal oscillation output signal SOH supplied from the horizontal oscillator 12 to the phase comparator 17 is appropriately adjusted in each horizontal synchronous circuit. However, since there is no any absolute standard for adjustment of the phase of the horizontal oscillation output signal SOH, it is very difficult to carry out appropriately the adjustment of the phase of the horizontal oscillation output signal SOH in each horizontal synchronous circuit. In addition, even if the adjustment of the phase of the horizontal oscillation output signal SOH is conducted in each horizontal synchronous circuit, the phase difference between the horizontal oscillation output signal SOH and the horizontal synchronizing signal SH in the horizontal synchronous circuit employed in each video projector is influenced by drift phenomenon arising in the horizontal oscillator 12 to be so varied thereby that each of the superimposed images is deviated from one another.

The problems mentioned above result from the fact that, with such a horizontal synchronous circuit as shown in FIG. 1, an appropriate maintenance on the phase of the horizontal oscillation output signal SOH toward the phase of the horizontal synchronizing signal SH is not guaranteed enough for satisfying a specific use, such as the use in each of the video projectors constituting the image projecting system.

OBJECTS AND SUMMARY OF THE INVENTION

Accordingly, it is an object of the present invention to provide a horizontal synchronous circuit in which a horizontal oscillation output signal obtained from a horizontal oscillator circuit portion is controlled by a free-running frequency controlling portion and an AFC portion to have a frequency coincident with the frequency of a horizontal synchronizing signal from the outside so as to synchronize with the horizontal synchronizing signal, and which avoids the aforementioned difficulties encountered with the prior art.

Another object of the present invention is to provide a horizontal synchronous circuit in which a horizontal oscillation output signal obtained from a horizontal oscillator circuit portion is controlled by a free-running frequency controlling portion and an AFC portion to have a frequency coincident with the frequency of a horizontal synchronizing signal from the outside so as to synchronize with the horizontal synchronizing signal, and the horizontal oscillation output signal is maintained with high precision to have an appropriate phase to the horizontal synchronizing signal from the outside.

Another object of the present invention is to provide a horizontal synchronous circuit in which a horizontal oscillation output signal obtained from a horizontal oscillator circuit portion is controlled by a free-running frequency controlling portion and an AFC portion to have a frequency coincident with the frequency of a horizontal synchronizing signal from the outside so as to synchronize with the horizontal synchronizing signal, and the stability of synchronization of the horizontal oscillation output signal with the horizontal synchronizing signal from the outside is effectively improved.

According to the present invention, there is provided a horizontal synchronous circuit comprising a horizontal oscillator circuit portion for generating a horizontal oscillation output signal having a predetermined frequency, an AFC portion operative to compare in phase the horizontal oscillation output signal obtained from the horizontal oscillator circuit portion with a horizontal synchronizing signal from the outside to produce a comparison output signal and to supply the horizontal oscillator circuit portion with a control signal based on the comparison output signal in order to control a frequency of the horizontal oscillation output signal, a free-running frequency control portion operative to produce a control signal corresponding to a frequency of the horizontal synchronizing signal from the outside and to supply the horizontal oscillator circuit portion with the control signal in order to control a free-running frequency of the horizontal oscillator circuit portion to be coincident with the frequency of the horizontal synchronizing signal from the outside, and a negative feedback control portion provided in addition to the AFC portion for producing an additional control signal based on the comparison output signal obtained from the AFC portion or the control signal supplied to the horizontal oscillator circuit portion and for controlling the free-running frequency of the horizontal oscillator circuit portion to vary in response to the additional control signal.

In the horizontal synchronous circuit thus constituted in accordance with the present invention, the negative feedback control portion is provided in addition to the free-running frequency control portion for controlling the free-running frequency in the horizontal oscillator circuit portion to be coincident with the frequency of the horizontal synchronizing signal from the outside and the AFC portion for controlling the horizontal oscillation output signal obtained from the horizontal oscillator circuit portion to have the frequency coincident with the frequency of the horizontal synchronizing signal from the outside so as to synchronize with the horizontal synchronizing signal from the outside. With the negative feedback control portion thus provided, the free-running frequency in the horizontal oscillator circuit portion is varied in response to the additional control signal which is produced based on the comparison output signal obtained from the AFC portion or the control signal supplied to the horizontal oscillator circuit portion and thereby an error in setting of the free-running frequency in the horizontal oscillator circuit portion is effectively reduced.

Such a control as to reduce the error in setting of the free-running frequency in the horizontal oscillator circuit portion is carried our by the negative feedback control portion in consideration of that a signal component corresponding to the error in setting of the free-running frequency in the horizontal oscillator circuit portion appears in the comparison output signal produced as the result of phase comparison between the horizontal oscillation output signal and the horizontal synchronizing signal from the outside and therefore the control signal produced based on the comparison output signal contains also a signal component corresponding to the error in setting of the free-running frequency in the horizontal oscillator circuit portion. The negative feedback control portion forms, for example, an additional negative feedback loop which operates at a lower speed with higher loop gain than a negative feedback loop formed by the AFC portion and causes the free-running frequency in the horizontal oscillator circuit portion to vary so that a minimum error is detected in the additional feedback loop.

Consequently, the error in setting of the free-running frequency in the horizontal oscillator circuit portion is sufficiently reduced, so that the horizontal oscillation output signal is maintained with high precision to have an appropriate phase to the horizontal synchronizing signal from the outside and the stability of synchronization of the horizontal oscillation output signal with the horizontal synchronizing signal from the outside is effectively improved.

Further, the horizontal synchronous circuit according to the present invention is fit for use in an image displaying apparatus for displaying selectively images reproduced based on various kinds of video signals containing respective horizontal synchronizing signals of different frequencies. When the horizontal synchronous circuit according to the present invention is used for such image displaying apparatus, a free-running frequency of a horizontal oscillator circuit portion in the horizontal synchronous circuit is set to be appropriate with superior precision, even if there are variations in oscillation frequency of the horizontal oscillator circuit portion against a control signal thereto, nonlinear control characteristic and so on.

Besides, in the case where the horizontal synchronous circuit according to the present invention is employed in each of a plurality of video projectors constituting an image projecting system in which the video projectors each arranged to reproduce the same image are used in such a manner that the images reproduced by the video projectors, respectively, are superimposed one another to obtain a light reproduced image, a phase difference between the images reproduced on each two of the video projectors, respectively, is effectively reduced and an undesirable condition in which each of the superimposed images is deviated from one another can be avoided.

The above, and other objects, features and advantages of the present invention will become apparent from the following detailed description taken in conjunction with the accompanying drawings.

BRIEF DESCRIPTION OF THE DRAWINGS

FIG. 2 is a schematic block diagram showing one example of horizontal synchronous circuit according to the present invention.

DESCRIPTION OF THE PREFERRED EMBODIMENT

Figure 1:
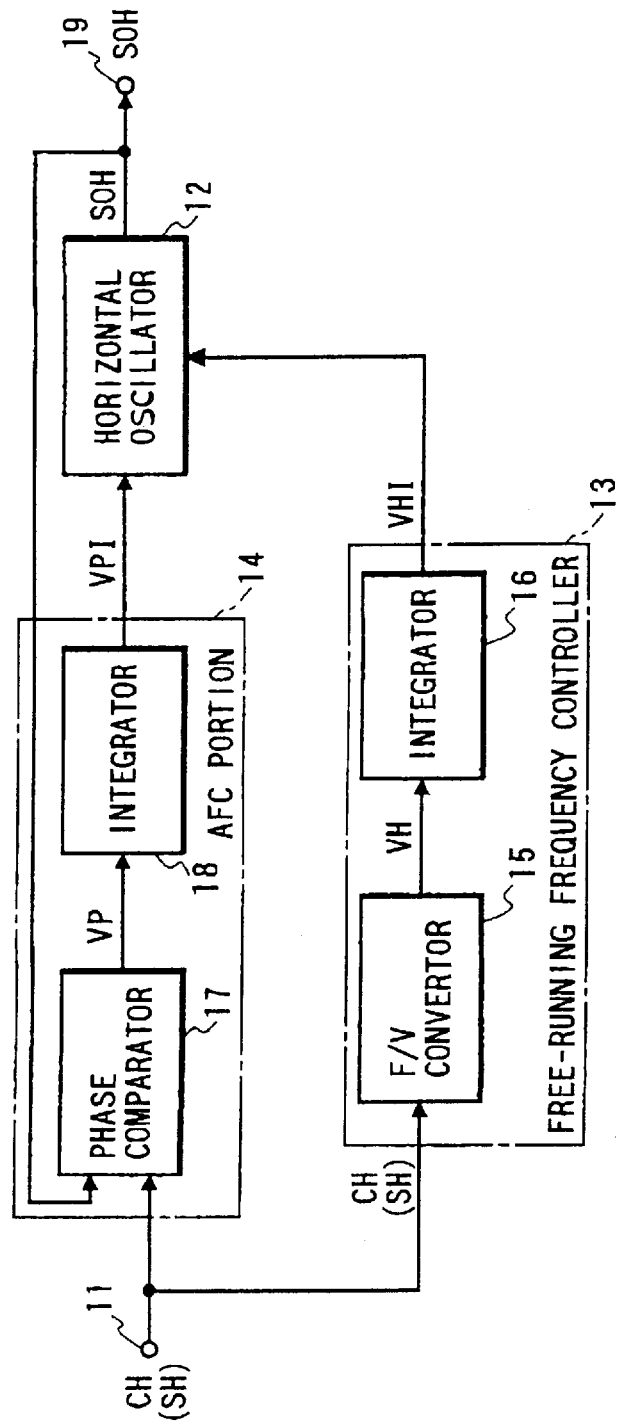
FIG. 1 is a schematic block diagram showing a previously proposed horizontal synchronous circuit.

FIG. 2 shows an embodiment of horizontal synchronous circuit according to the present invention.

Referring to FIG. 2, a plurality of composite synchronizing signals CH each including a horizontal synchronizing signal SH contained in each of various kinds of video signals from the outside, such as a video signal obtained from a television broadcast signal, a video signal derived from a computer and so on, are selectively supplied to a terminal 21. Under a condition in which the composite synchronizing signals CH each including the horizontal synchronizing signal SH are selectively supplied to the terminal 21, the frequency and phase of a horizontal oscillation output signal SOH obtained from a horizontal oscillator 22 is controlled by a free-running frequency controller 23, an AFC portion 24 and a negative feedback controller 25, and thereby the horizontal oscillation output signal SOH which has a frequency coincident with the frequency of the horizontal synchronizing signal SH included in one of the composite synchronizing signals CH and is maintained with high precision to have an appropriate phase to the horizontal synchronizing signal SH so that the synchronization with the horizontal synchronizing signal SH is effectively stabilized, is derived from the horizontal oscillator 22 to an output terminal 26 as a horizontal output signal.

The free-running frequency controller 23 is constituted with a F/V convertor 27 for producing a voltage signal VH which corresponds to the frequency of the horizontal synchronizing signal SH included in the composite synchronizing signal CH from the terminal 21 supplied thereto and an integrator 28 for integrating the voltage signal VH from the F/V convertor 27 and thereby for producing an integration output to be derived therefrom as a control signal VHI. This free-running frequency controller 23 supplies the horizontal oscillator 22 through a signal adder 29 with the control signal VHI so as to control the free-running frequency of the horizontal oscillator 22 to be coincident with the frequency of the horizontal synchronizing signal SH included in the composite synchronizing signal CH from the terminal 11. With such a control by the free-running frequency controller 23, the setting of the free-running frequency in the horizontal oscillator 22 is carried out.

The AFC portion 24 is constituted with a phase comparator 30 operative to compare in phase the horizontal oscillation output signal SOH obtained from the horizontal oscillator 22 with the horizontal synchronizing signal SH included in the composite synchronizing signal CH from the terminal 11 and thereby to produce a comparison output signal VP corresponding to a phase difference between the horizontal oscillation output signal SOH and the horizontal synchronizing signal SH, and an integrator 31 for integrating the comparison output signal VP obtained from the phase comparator 30 and thereby for producing an integration output to be derived therefrom as a control signal VPI to be supplied to the horizontal oscillator 22.

The AFC portion 24 thus constituted forms a negative feedback loop relative to the horizontal oscillator 22. This negative feedback loop is so arranged as to have an integration time constant optimized in view of noise elimination, to be, for example, several milliseconds and a loop gain intended to be relatively low. Therefore, when an error in setting of the free-running frequency in the horizontal oscillator 22 exists, a signal component corresponding to the error in setting of the free-running frequency in the horizontal oscillator 22 appears in the the comparison output signal VP obtained from the phase comparator 30, and as a result, the control signal VPI which is produced by the integrator 31 based on the comparison output signal VP contains also a signal component corresponding to the error in setting of the free-running frequency in the horizontal oscillator 22.

The AFC portion 24 is operative to control, in response to the control signal VPI obtained from the integrator 31, the horizontal oscillation output signal SOH obtained from the horizontal oscillator 22 to have the frequency coincident with the frequency of the horizontal synchronizing signal SH included in the composite synchronizing signal CH from the terminal 21 so as to synchronize with the horizontal synchronizing signal SH.

The negative feedback controller 25 is constituted with an average value detector 32 for detecting an average value of the control signal VPI which is supplied from the integrator 31 in the AFC portion 24 to the horizontal oscillator 22 and producing a detection output signal VPA representing a detected average value, and a control amplifier 33 for amplifying the detection output signal VPA obtained from the average value detector 32 to be an additional control signal VPA'. The average value detector 32 is composed of, for example, a low pass filter or the like. The negative feedback controller 25 thus constituted forms also a negative feedback loop relative to the horizontal oscillator 22. This negative feedback loop is so arranged as to operate at a lower speed with higher loop gain than the negative feedback loop formed by the AFC portion 24.

The negative feedback controller 25 is operative to supply the horizontal oscillator 22 through the signal adder 29 with the additional control signal VPA' obtained from the control amplifier 33 and to control the free-running frequency of the horizontal oscillator 22 to vary in response to the additional control signal VPA' so that the error in setting of the free-running frequency in the horizontal oscillator 22 is effectively reduced. The additional control signal VPA' obtained from the control amplifier 33 is added to the control signal VHI obtained from the integrator 28 in the free-running frequency controller 23 at the signal adder 29 to be supplied to the horizontal oscillator 22 together with the control signal VHI. With such a control by the negative feedback controller 25, the horizontal oscillation output signal SOH derived from the horizontal oscillator 22 is so produced as to have the frequency coincident with the frequency of the horizontal synchronizing signal SH included in the composite synchronizing signals CH and to be maintained with high precision to have an appropriate phase to the horizontal synchronizing signal SH so that the synchronization with the horizontal synchronizing signal SH is effectively stabilized.

In such a horizontal synchronous circuit according to the present invention as shown in FIG. 2, when the error in setting of the free-running frequency in the horizontal oscillator 22 exists, the control signal VPI which is supplied from the AFC portion 24 to the average value detector 32 in the negative feedback controller 25 contains the signal component corresponding to the error in setting of the free-running frequency in the horizontal oscillator 22. The negative feedback controller 25, in which the detection output signal VPA obtained from the average value detector 32 operative to detect the average value of the control signal VPI is amplified by the control amplifier 33 to produce the additional control signal VPA', causes the free-running frequency of the horizontal oscillator 22 to vary in response to the additional control signal VPA' so as to reduce the error in setting of the free-running frequency in the horizontal oscillator 22. In this operation, since the negative feedback loop formed relative to the horizontal oscillator 22 by the negative feedback controller 25 operates at the lower speed with higher loop gain than the negative feedback loop formed by the AFC portion 24, the control with the additional control signal VPA' by the negative feedback controller 25 for reducing the error in setting of the free-running frequency in the horizontal oscillator 22 is carried out with superior precision, so that the free-running frequency of the horizontal oscillator 22 is set to be appropriate with superior precision and the average value of the control signal VPI from the AFC portion 24 can be reduced to zero. Consequently, the horizontal oscillation output signal SOH derived from the horizontal oscillator 22 is so produced as to maintained with high precision to have an appropriate phase to the horizontal synchronizing signal SH.

The horizontal synchronous circuit according to the present invention should not be limited to the embodiment shown in FIG. 2. For example, as indicated with a broken line in FIG. 2, the comparison output signal VP obtained from the phase comparator 30 in the AFC portion 24 can be directly supplied to the average value detector 32 in the negative feedback controller 25, in place of the control signal VPI obtained from the integrator 31 in the AFC portion 24. Further, various variations, such as to cause the additional control signal VPA' obtained from the control amplifier 33 in the negative feedback controller 25 to be subjected to a sampling at every vertical period of a video signal for stabilizing furthermore the negative feedback loop formed by the negative feedback controller 25, to provide the negative feedback controller 25 with a hysteresis characteristic, to constitute the control amplifier 33 in the negative feedback controller 25 with a digital circuit structure including an analog to digital (A/D) convertor and a microcomputer for achieving a nonlinear control to the negative feedback controller 25, and so on, may be derived from the embodiment shown in FIG. 2.

What is claimed is:

1. A horizontal synchronous circuit comprising;
   a horizontal oscillator circuit portion for generating a horizontal oscillation output signal having a predetermined frequency,
   an automatic frequency control portion operative to compare in phase the horizontal oscillation output signal obtained from the horizontal oscillator circuit portion with a horizontal synchronizing signal from the outside to produce a comparison output signal and to supply the horizontal oscillator circuit portion with a frequency control signal based on the comparison output signal in order to control a frequency of the horizontal oscillation output signal,
   a free-running frequency control portion operative to produce a free-running control signal corresponding to a frequency of the horizontal synchronizing signal from the outside and to supply the horizontal oscillator circuit portion with the free-running control signal in order to control a free-running frequency of the horizontal oscillator circuit portion to be coincident with the frequency of the horizontal synchronizing signal from the outside, and
   a negative feedback control portion operative to produce an additional control signal based on the comparison output signal obtained from the automatic frequency control portion and the frequency control signal supplied to the horizontal oscillator circuit portion for controlling the free-running frequency of the horizontal oscillator circuit portion in response to the additional control signal.

2. A horizontal synchronous circuit according to claim 1, wherein said automatic frequency control portion comprises a phase comparator operative to compare in phase the horizontal oscillation output signal obtained from the horizontal oscillator circuit portion with the horizontal synchronizing signal from the outside to produce the comparison output signal and an integrator for integrating the comparison output signal obtained from the phase comparator to produce the frequency control signal.

3. A horizontal synchronous circuit according to claim 1, wherein said negative feedback control portion is operative to detect an average value of one of the comparison output signal obtained from the automatic frequency control portion and the frequency control signal supplied to the horizontal oscillator circuit portion to produce the additional control signal in response to a detected average value.

4. A horizontal synchronous circuit according to claim 3, wherein said negative feedback control portion comprises an average value detector for detecting the average value of the comparison output signal obtained from the automatic frequency control portion and the frequency control signal supplied to the horizontal oscillator circuit portion, and an amplifier for amplifying a detection output signal obtained from the average value detector to product the additional control signal.

5. A horizontal synchronous circuit according to claim 4, wherein said average value detector in the negative feedback control portion comprises a low pass filter.

6. A horizontal synchronous circuit according to claim 1, wherein said negative feedback control portion forms a negative feedback loop relative to the horizontal oscillator circuit portion, said negative feedback loop being so arranged as to operate at a lower speed with higher loop-gain than another negative feedback loop formed by the automatic frequency control portion.

7. A horizontal synchronous circuit according to claim 1, wherein said additional control signal obtained from the negative feedback control portion is added to the free-running control signal obtained from the free-running frequency control portion to be supplied to the horizontal oscillator circuit portion.

8. A horizontal synchronous circuit according to claim 1, wherein said free-running frequency control portion comprises a frequency to voltage convertor for producing a voltage signal corresponding to the frequency of the horizontal synchronizing signal from the outside and an integrator for integrating the voltage signal from the frequency to voltage convertor to produce the free-running control signal.

9. A horizontal synchronous circuit for use in an image displaying apparatus for displaying selectively images reproduced based on various kinds of video signals containing respective horizontal synchronizing signals of different frequencies, the circuit comprising;
   a horizontal oscillator circuit portion for generating a horizontal oscillation output signal having a predetermined frequency,
   an automatic frequency control portion operative to compare in phase the horizontal oscillation output signal obtained from the horizontal oscillator circuit portion with the horizontal synchronizing signal contained in one of the video signals to produce a comparison output signal and to supply the horizontal oscillator circuit portion with a frequency control signal based on the comparison output signal in order to control a frequency of the horizontal oscillation output signal,
   a free-running frequency control portion operative to produce a free-running control signal corresponding to a frequency of the horizontal synchronizing signal from the outside and to supply the horizontal oscillator circuit portion with the free-running control signal in order to control a free-running frequency of the horizontal oscillator circuit portion to be coincident with the frequency of the horizontal synchronizing signal contained in said one of the video signals, and
   a negative feedback control portion operative to produce an additional control signal based on the comparison output signal obtained from the automatic frequency control portion and the frequency control signal supplied to the horizontal oscillator circuit portion for controlling the free-running frequency of the horizontal oscillator circuit portion in response to the additional control signal.

10. A horizontal synchronous circuit according to claim 9, wherein said automatic frequency control portion comprises a phase comparator operative to compare in phase the horizontal oscillation output signal obtained from the horizontal oscillator circuit portion with the horizontal synchronizing signal contained in said one of the video signals to produce the comparison output signal and an integrator for integrating the comparison output signal obtained from the phase comparator to produce the frequency control signal.

11. A horizontal synchronous circuit according to claim 9, wherein said negative feedback control portion comprises an average value detector for detecting an average value of the comparison output signal obtained from the automatic frequency control portion and the frequency control signal supplied to the horizontal oscillator circuit portion and an amplifier for amplifying a detection output signal obtained from the average value detector to produce the additional control signal.

12. A horizontal synchronous circuit according to claim 11, wherein said average value detector in the negative feedback control portion comprises a low pass filter.

13. A horizontal synchronous circuit according to claim 9, wherein said negative feedback control portion forms a negative feedback loop relative to the horizontal oscillator circuit portion, said negative feedback loop being so arranged as to operate at a lower speed with higher loop gain than another negative feedback loop formed by the automatic frequency control portion.

14. A horizontal synchronous circuit according to claim 9, wherein said free-running frequency control portion comprises a frequency to voltage convertor for producing a voltage signal corresponding to the frequency of the horizontal synchronizing signal contained in said one of the video signals and an integrator for integrating the voltage signal from the frequency to voltage convertor to produce the free-running control signal.

* * * * *